(12) United States Patent
Ng et al.

(10) Patent No.: US 7,665,046 B2
(45) Date of Patent: Feb. 16, 2010

(54) METHOD AND SYSTEM FOR DEBUGGING USING REPLICATED LOGIC AND TRIGGER LOGIC

(75) Inventors: Chun Kit Ng, Portland, OR (US); Kenneth S. McElvain, Los Altos, CA (US)

(73) Assignee: Synopsys, Inc., Mountain View, CA (US)

( * ) Notice: Subject to any disclaimer, the term of this patent is extended or adjusted under 35 U.S.C. 154(b) by 479 days.

(21) Appl. No.: 11/732,784

(22) Filed: Apr. 3, 2007

(65) Prior Publication Data

US 2007/0186195 A1 Aug. 9, 2007

Related U.S. Application Data

(60) Division of application No. 11/112,092, filed on Apr. 22, 2005, now Pat. No. 7,213,216, which is a continuation-in-part of application No. 10/215,869, filed on Aug. 9, 2002, now Pat. No. 6,904,576.

(51) Int. Cl.
*G06F 17/50* (2006.01)

(52) U.S. Cl. .................. 716/1; 716/4; 716/5; 716/6; 716/18; 703/13; 703/14

(58) Field of Classification Search .................. 716/1, 716/4–6, 18; 703/13–14
See application file for complete search history.

(56) References Cited

U.S. PATENT DOCUMENTS 5,056,094 A 10/1991 Whetsel (Continued)

FOREIGN PATENT DOCUMENTS

EP 1168206 A2 1/2002

(Continued)

OTHER PUBLICATIONS

Koch, Gernot H., et al. "Breakpoints and Breakpoint Detection in Source-Level Emulation," *ACM Transactions on Design Automation of Electronic Systems*, 3:2 (Apr. 1998), pp. 209-230.

(Continued)

*Primary Examiner*—Jack Chiang
*Assistant Examiner*—Nghia M Doan
(74) *Attorney, Agent, or Firm*—Blakely, Sokoloff, Taylor & Zafman LLP

(57) ABSTRACT

A method and system for debugging using replicated logic and trigger logic is described. A representation of a circuit is compiled. One or more signals are selected for triggering and trigger logic is inserted into the circuit. A portion of the circuit is selected for replication. The selected portion of the circuit is replicated and delay logic is inserted to delay the inputs into the replicated portion of the circuit. The representation of the circuit is recompiled and programmed into a hardware device. A debugger may then be invoked. One or more of the triggering signals are selected. For each selected triggering signal, one or more states are selected to setup a trigger condition. The hardware device may then be run. The replicated portion of the circuit will be paused when the trigger condition occurs. The states of registers in the replicated portion of the circuit and the sequence of steps that led to the trigger condition may then be recorded.

3 Claims, 4 Drawing Sheets

U.S. PATENT DOCUMENTS

| | | | |
|---|---|---|---|
| 5,309,035 | A | 5/1994 | Watson, Jr. et al. |
| 5,452,239 | A | 9/1995 | Dai et al. |
| 5,495,487 | A | 2/1996 | Whetsel, Jr. |
| 5,706,473 | A | 1/1998 | Yu et al. |
| 5,923,676 | A | 7/1999 | Sunter et al. |
| 6,014,510 | A | 1/2000 | Burks et al. |
| 6,269,467 | B1 | 7/2001 | Chang et al. |
| 6,438,735 | B1 | 8/2002 | McElvain et al. |
| 6,516,449 | B2 | 2/2003 | Masud |
| 6,519,754 | B1 | 2/2003 | McElvain et al. |
| 6,530,073 | B2 | 3/2003 | Morgan |
| 6,557,145 | B2 | 4/2003 | Boyle et al. |
| 6,580,299 | B2 | 6/2003 | Horan et al. |
| 6,651,227 | B2 | 11/2003 | Abadir et al. |
| 6,668,364 | B2 | 12/2003 | McElvain et al. |
| 6,687,882 | B1 | 2/2004 | McElvain et al. |
| 6,701,491 | B1 | 3/2004 | Yang |
| 6,725,406 | B2 * | 4/2004 | Kakizawa et al. ........... 714/727 |
| 6,871,329 | B2 | 3/2005 | Matsumoto |
| 6,904,576 | B2 | 6/2005 | Ng et al. |
| 7,010,769 | B2 | 3/2006 | McElvain et al. |
| 7,055,117 | B2 | 5/2006 | Yee |
| 7,065,481 | B2 | 6/2006 | Schubert et al. |
| 2001/0025369 | A1 | 9/2001 | Chang et al. |
| 2002/0138801 | A1 | 9/2002 | Wang et al. |
| 2003/0069724 | A1 | 4/2003 | Schubert et al. |
| 2003/0079195 | A1 | 4/2003 | McElvain et al. |
| 2003/0115564 | A1 | 6/2003 | Chang et al. |
| 2004/0030999 | A1 | 2/2004 | Ng et al. |
| 2004/0215435 | A1 | 10/2004 | Hunt et al. |

FOREIGN PATENT DOCUMENTS

| | | |
|---|---|---|
| JP | 10010196 A | 1/1998 |
| JP | 10177590 A | 6/1998 |
| KR | 10-0710972 B1 | 4/2007 |
| KR | 10-0767957 B1 | 10/2007 |
| KR | 10-0812938 B1 | 3/2008 |

OTHER PUBLICATIONS

Neumann, I. et al., "Cell Replication and Redundancy Elimination During Placement for Cycle Time Optimization," 1999 IEEE/ACM International Conference on Computer-Aided Design, Nov. 1999, pp. 25-30.

PCT International Search Report and Written Opinion for PCT International Appln No. US2006/030417, mailed Jan. 8, 2007 (10 pages).

PCT International Search Report and Written Opinion for PCT International Appln No. US2006/013910, mailed Feb. 1, 2007 (12 pages).

PCT International Search Report for PCT International Appln No. US03/24601, mailed Apr. 16, 2004 (7 pages).

PCT International Preliminary Report on Patentability for PCT Appln. No. US2006/013910, mailed Nov. 1, 2007 (8 pages).

PCT International Preliminary Report on Patentability for PCT International Appln No. PCT/US2006/030417, mailed Feb. 14, 2008 (7 pages).

PCT International Preliminary Report on Patentability for PCT Appln. No. US03/24601, mailed Feb. 12, 2007 (6 pages).

Courtoy, Michel. "Rapid Prototyping for Communications Design Validation," Southcon/96 Conference Record, IEEE (Jun. 25-27, 1996), pp. 49-54.

* cited by examiner

METHOD AND SYSTEM FOR DEBUGGING USING REPLICATED LOGIC AND TRIGGER LOGIC

PRIORITY INFORMATION

This application is a divisional of U.S. patent application Ser. No. 11/112,092, filed on Apr. 22, 2005 now U.S. Pat. No. 7,213,216, which is a continuation-in-part (CIP) of U.S. patent application Ser. No. 10/215,869, filed on Aug. 9, 2002 and issued as U.S. Pat. No. 6,904,576.

TECHNICAL FIELD

Embodiments of the invention relate to the field of debugging integrated circuits, and more specifically to debugging integrated circuits using replicated logic and trigger logic.

BACKGROUND

For the design of digital circuits, designers often employ computer aided techniques. Standard languages, such as Hardware Description Languages (HDLs), have been developed to describe digital circuits to aid in the design and simulation of complex digital circuits. As device technology continues to advance, various product design tools have been developed to adapt HDLs for use with newer devices and design styles.

After the HDL code is written and compiled, the design of an integrated circuit (IC) or a system which includes multiple ICs must be verified to be correct. Continually advancing processing technology and the corresponding explosion in design size and complexity have led to verification problems for complex circuit designs, such as Application Specific Integrated Circuits (ASICs) that are difficult to solve using traditional simulation tools and techniques.

As a result, some designers build prototype boards using multiple ICs such as field programmable gate arrays (FPGAs) to verify their ASIC designs. However, there are still problems with debugging the hardware design. When an error is detected during debug, designers may attempt to tap signals of interest from the circuit and use a logic analyzer to determine the cause of the error. However, this is a difficult process and is often not effective, especially in the case of intermittent errors. Errors that have already occurred are often difficult to repeat and reconstruct.

BRIEF DESCRIPTION OF THE DRAWINGS

The invention is illustrated by way of example, and not by way of limitation, in the figures of the accompanying drawings in which like reference numerals refer to similar elements.

DETAILED DESCRIPTION

Embodiments of a system and method for debugging using replicated logic and trigger logic are described. In the following description, numerous specific details are set forth. However, it is understood that embodiments of the invention may be practiced without these specific details. In other instances, well-known circuits, structures and techniques have not been shown in detail in order not to obscure the understanding of this description.

Reference throughout this specification to "one embodiment" or "an embodiment" means that a particular feature, structure, or characteristic described in connection with the embodiment is included in at least one embodiment of the invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
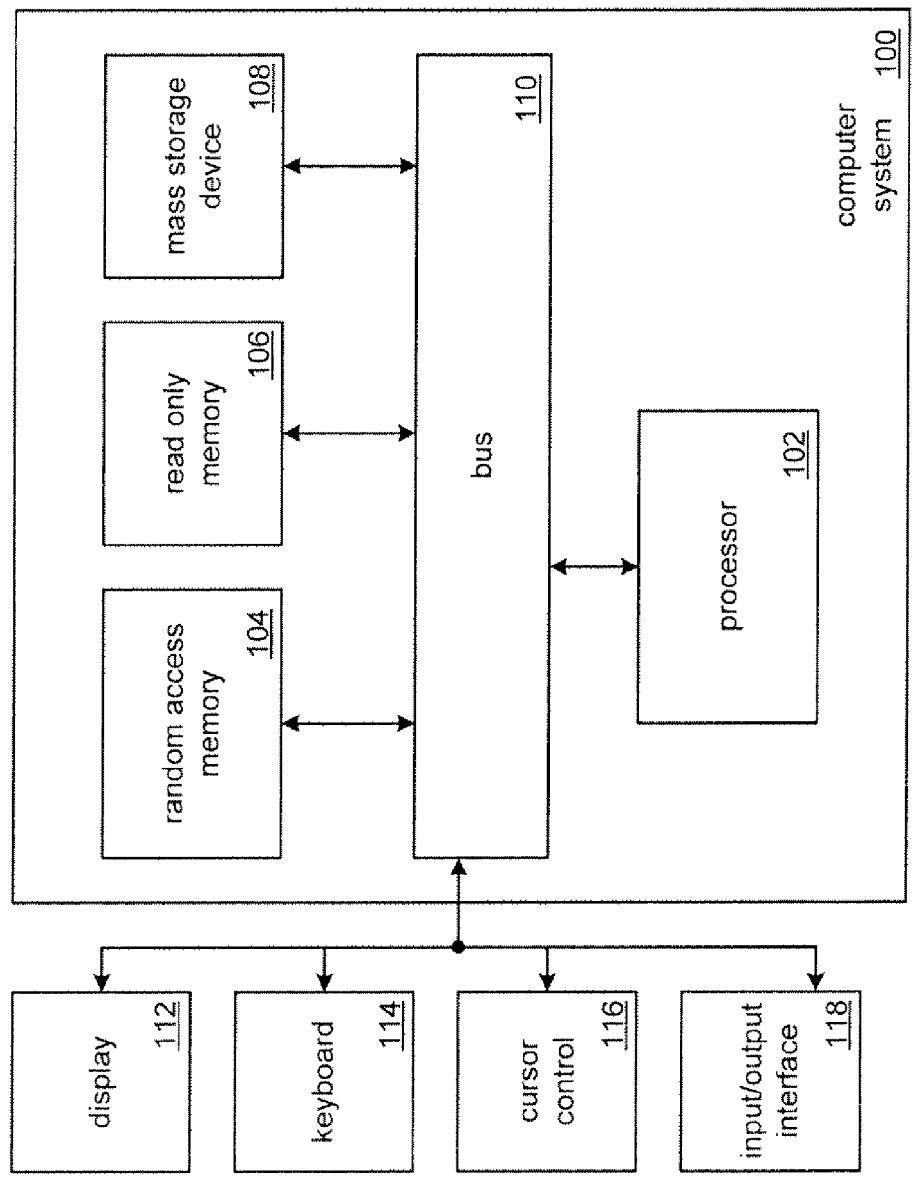
FIG. 1 illustrates a block diagram of a computer system that may be used to implement embodiments of the invention.

FIG. 1 illustrates a block diagram of a computer system 100 that may be used to implement an embodiment of the invention. The computer system 100 includes a processor 102 coupled through a bus 110 to a random access memory (RAM) 104, a read-only memory (ROM) 106, and a mass storage device 108. Mass storage device 108 represents a persistent data storage device, such a floppy disk drive, fixed disk drive (e.g. magnetic, optical, magneto-optical, or the like), or streaming tape drive. Processor 102 may be embodied in a general purpose processor, a special purpose processor, or a specifically programmed logic device.

Display device 112 is coupled to processor 102 through bus 110 and provides graphical output for computer system 100. Keyboard 114 and cursor control unit 116 are coupled to bus 110 for communicating information and command selections to processor 102. Also coupled to processor 102 through bus 110 is an input/output (I/O) interface 118, which can be used to control and transfer data to electronic devices (printers, other computers, etc.) connected to computer system 100.

It should be noted that the architecture of FIG. 1 is provided only for purposes of illustration, and that a computer used in conjunction with embodiments of the invention is not limited to this specific architecture.

As will be appreciated by those skilled in the art, the content for implementing an embodiment of a method of the invention, for example, computer program instructions, may be provided by any machine-readable media which can store data that is accessible by system 100, as part of or in addition to memory, including but not limited to cartridges, magnetic cassettes, flash memory cards, digital video disks, random access memories (RAMs), read-only memories (ROMs), and the like. In this regard, the system 100 is equipped to communicate with such machine-readable media in a manner well-known in the art.

It will be further appreciated by those skilled in the art that the content for implementing an embodiment of the method of the invention may be provided to the system 100 from any external device capable of storing the content and communicating the content to the system 100. For example, in one embodiment, the system 100 may be connected to a network, and the content may be stored on any device in the network.

Figure 2:
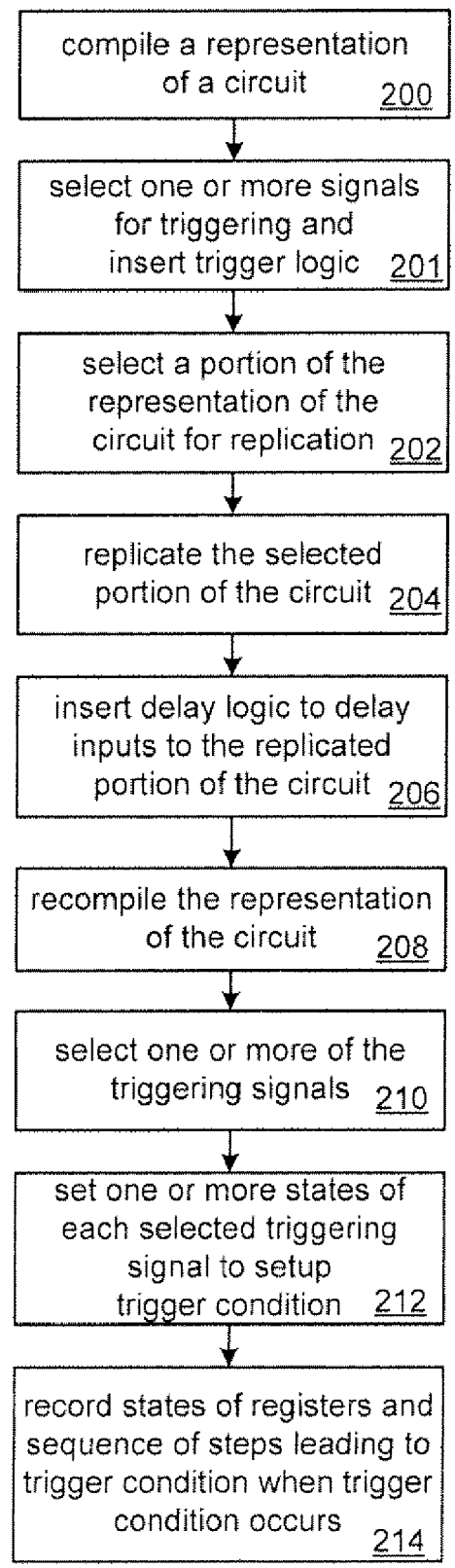
FIG. 2 is a flow chart illustrating an embodiment of a method of the invention.

FIG. 2 is a flow chart illustrating an embodiment of a method of the invention. At 200, a representation of a circuit is compiled. In one embodiment, the compilation generates a first register transfer (RTL) netlist. In one embodiment, the circuit is described by a text representation by writing Hardware Description Language (HDL) source code descriptions of the elements of the circuit. In one embodiment, the circuit is described by a netlist representation.

The representation of the circuit is then input into a compiler. One example of a compiler is a logic synthesis compiler, which is typically a computer program that operates on a general purpose computer system, although in some embodiments, the computer system may be a dedicated, special purpose computer system. After compilation, a RTL netlist may be generated. The RTL netlist usually shows registers and other logic interconnected to show the flow of data through the circuit.

In one embodiment of the invention, the RTL netlist is mapped to a target architecture. The target architecture is typically determined by a supplier of the integrated circuit (IC). Examples of target architectures include field programmable gate arrays (FPGAs) and complex programmable logic devices from vendors such as Altera, Lucent Technologies, Advanced Micro Devices (AMD), and Lattice Semiconductor. The mapping operation converts the RTL level description of the desired circuit into the equivalent circuit implemented using building blocks of the target architecture. A technology specific netlist is generated. Conventional place and route software tools may then be used to create a design of circuitry in the target architecture.

For debugging purposes, IC designers may build prototype boards using multiple ICs such as FPGAs to verify their designs. For example, after the compilation, mapping, and place and route operations, the circuit may be programmed into FPGAs to create a prototype of the design. The FPGAs can then be tested to determine any problem areas in the design.

When a problem area is found in the design, the designer may further analyze the problem by selecting that portion of the circuit to replicate and by inserting trigger logic. At 201, one or more signals are selected for triggering. These selected signals may be used later as trigger signals to enable a trigger condition. Triggering logic is then inserted into the circuit. One or more controllers for the triggering logic may also be inserted into the circuit. At 202, a portion of the circuit is selected for replication. At 204, the selected portion of the circuit is replicated. This replication may include a replication of the logic elements, the input signals, and the output signals of the selected portion of the circuit. In one embodiment, each register in the replicated portion of the circuit is connected together in a scan chain, such as a JTAG chain. This scan chain allows information from the registers, such as their states, to be scanned out during debug.

In one embodiment of the invention, clock signals are also replicated. Clock control logic is inserted to control the clock signals. The clock control logic allows the clock to the replicated logic block to be paused to stop the replicated logic from executing when certain conditions are present and to allow for single-stepping through the replicated logic to analyze an error. The designer may select a breakpoint to pause the clock to the replicated portion of the circuit when certain conditions are present. For example, the designer may choose values for the outputs or inputs that will pause the clock. This allows the designer to analyze the selected logic more carefully when certain problem conditions are present.

At 206, delay logic is inserted to delay inputs into the replicated portion of the circuit. The length of the delay may be selected by the circuit designer. The delay logic allows an error observed in the selected portion of the circuit to be analyzed after the error is seen to occur since the error will reappear in the replicated portion of the circuit at a later time.

At 208, the representation of the circuit is recompiled. In one embodiment, the compilation generates a second RTL netlist. Then, the mapping and place and route operations may be performed using the second RTL netlist to implement the circuit in a target architecture, such as a FPGA. In one embodiment of the invention, a synthesis operation is performed to generate an application specific integrated circuit (ASIC) from the second RTL netlist. A circuit with replicated logic is produced that allows a circuit designer to analyze a problem area in the design. The designer may invoke a debugger to assist in the debugging of the circuit.

At 210, one or more of the triggering signals are selected. These signals are selected from the set of signals chosen at 201. At 212, one or more states of each selected triggering signal are set to setup a triggering condition. At 214, when the trigger condition occurs, one or more states of one or more registers and the sequence of steps that led to the trigger condition are recorded. The replicated logic may be stepped clock by clock with the value of the inputs recorded at every clock. This input stream represents the sequence of steps leading to the trigger condition that is being analyzed. The states of the registers in the replicated logic may also be recorded by using the scan chain implemented at 204. In one embodiment, this recorded information may be converted into a format that is compatible with a software simulator. For instance, if the software simulator is a VHDL or a Verilog simulator, then the recorded information may be converted to VHDL or Verilog, respectively. The recorded information may then be input into the software simulator for further analysis of the circuit.

The following example is described for illustrative purposes. Suppose that at 201, signals a, b, and d are selected as signals that may be used for triggering. The representation of the circuit has been compiled and programmed into a hardware device. A debugger is then invoked. At 210, the triggering signals are selected from the set of signals chosen at 201. The signals available for selection are signals a, b, and d. Suppose the user chooses signals a and d as triggering signals. At 212, the states of signals a and d are set to setup the trigger condition. For instance, the user may select the trigger condition to be when signal a is 1 and when signal d goes from 0 to 1. The circuit may then be run on the hardware device. The replicated portion of the circuit will pause when the trigger condition occurs, which in this case would occur when signal a is 1 and signal d goes from 0 to 1. The sequence of steps that led to the triggering condition would then be recorded. The states of registers in the replicated portion of the circuit would also be recorded. This information may then be formatted and input into a software simulator for further analysis.

Figure 3:
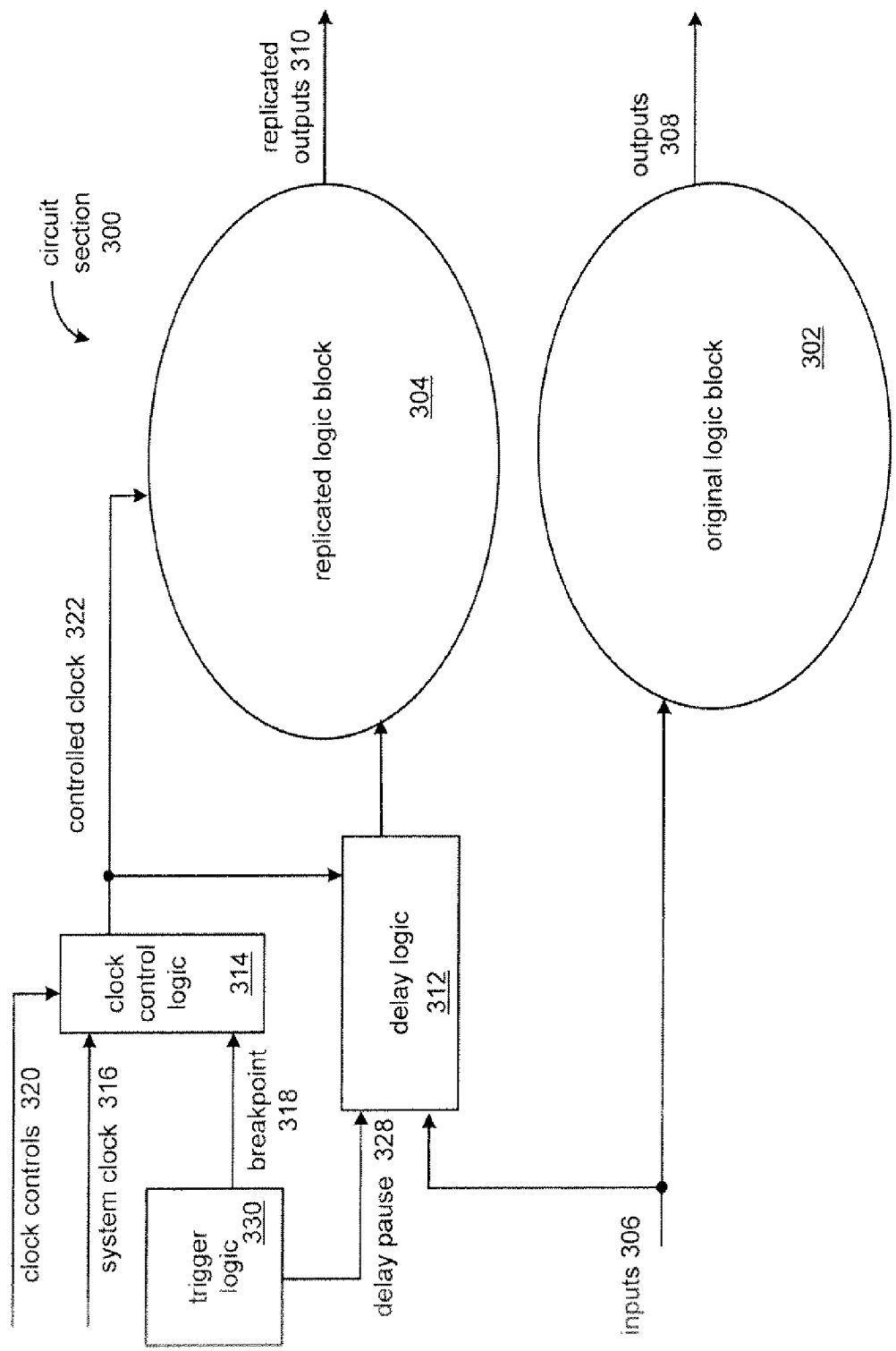
FIG. 3 illustrates an example of a circuit section implementing an embodiment of the invention.

FIG. 3 illustrates an example of a section of a circuit 300 implementing an embodiment of the invention. Logic block 302 is a portion of the circuit in the original IC design. Debug of the original IC design revealed a problem with logic block 302. Therefore, original logic block 302 was selected and replicated to enable further analysis of the problem. The original logic block 302 is replicated to produce a replicated logic block 304. Outputs 308 from the original logic block 302 are replicated to produce replicated outputs 310. Inputs 306 may also be replicated.

Delay logic 312 is inserted to delay inputs 306 into replicated logic block 304. The delay logic includes typical circuit logic and elements, such as inverters, that cause the inputs 306 to arrive at the replicated logic block 304 later in time than the inputs 306 will arrive at the original logic block 302. In this way, an error can be analyzed after the error is seen to occur in the original logic block, since the error will appear in the replicated logic block at a later time.

Trigger logic 330 is inserted into the circuit to enable the setup of a trigger condition that pauses the replicated portion of the circuit. One or more controllers may also be inserted to control the trigger logic. The trigger logic 330 has two outputs: breakpoint 318 and delay pause 328. Breakpoint 318 enables the clock control logic 314 to stop advancing. Delay pause 328 enables the delay logic 312 to stop advancing.

Clock control logic 314 is inserted to control the clock signals 322 to the replicated logic block 304. The clock control logic 314 contains typical logic and circuit elements that allow the clock 322 to the replicated logic block 304 to be paused to stop the replicated logic from executing when certain conditions are present. The clock control logic 314 may also allow for single stepping through the replicated logic on a clock by clock basis to analyze an error. The breakpoint 318 may be set to pause the clock when certain conditions are present, such as when the trigger condition occurs.

Figure 4:
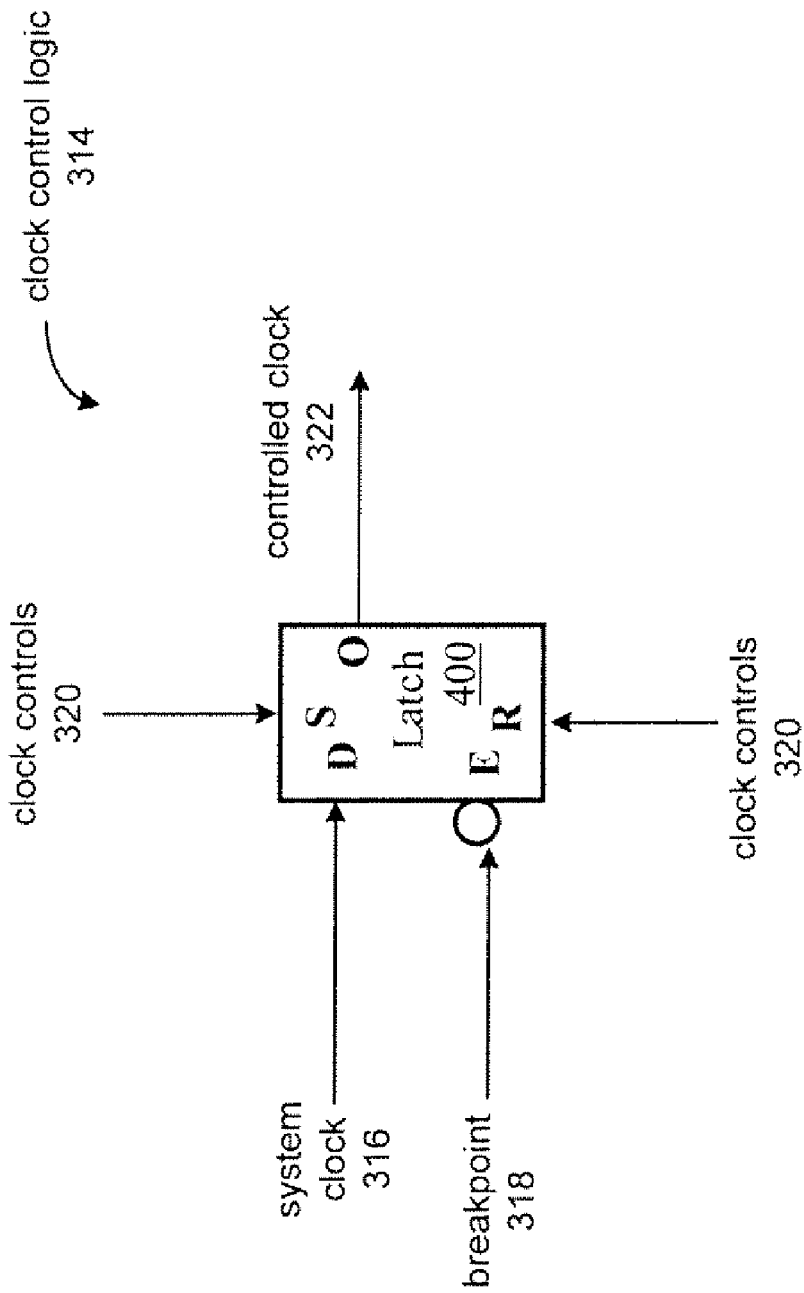
FIG. 4 illustrates an example of clock control logic according to an embodiment of the invention.

FIG. 4 illustrates an example of the clock control logic 314 according to an embodiment of the invention. During normal operation, the system clock 316 that clocks the circuit flows through the latch 400 and acts as the clock 322 to the replicated logic block 304. The breakpoint 318 switches the clock 322 to a latched version of the system clock 316, which can be controlled by clock control signals 320 in order to allow the clock 322 to be paused and single-stepped on a cycle by cycle basis.

Thus, embodiments of a method and apparatus for debugging using replicated logic and trigger logic have been described. The above description of illustrated embodiments of the invention, including what is described in the abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize. These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. An integrated circuit comprising:
   a plurality of logic elements;
   a replication of one or more of the logic elements;
   delay logic coupled to the replicated portion of the circuit to delay inputs into the replicated portion of the circuit;
   trigger logic coupled to the replicated portion of the circuit to enable setup of a trigger condition; and
   clock control logic coupled to the replicated portion of the circuit to enable the execution of the replicated portion of the circuit to be paused when the trigger condition occurs.

2. The integrated circuit of claim 1, wherein the clock control logic includes a breakpoint to pause the replicated portion of the circuit.

3. The integrated circuit of claim 1, wherein the clock control logic further includes logic to enable the replicated portion of the circuit to be executed on a clock by clock basis.

* * * * *